(12) United States Patent
Cao et al.

(10) Patent No.: US 7,940,822 B1
(45) Date of Patent: May 10, 2011

(54) TRACKING INJECTION SEEDING POWER BASED ON BACK FACET MONITORING (BFM) OF AN INJECTION SEEDED LASER

(75) Inventors: Bin Cao, Kanata (CA); Douglas James Beckett, Kanata (CA); Tom Luk, Ottawa (CA); Rong Chen, Ottawa (CA)

(73) Assignees: Nortel Networks Limited, Mississauga, Ontario (CA); LG-Nortel, Co. Ltd., Seoul (KR)

( * ) Notice: Subject to any disclaimer, the term of this patent is extended or adjusted under 35 U.S.C. 154(b) by 0 days.

(21) Appl. No.: 12/620,745

(22) Filed: Nov. 18, 2009

(51) Int. Cl.
*H01S 3/13* (2006.01)
*H01S 3/00* (2006.01)

(52) U.S. Cl. .............................. 372/29.021; 372/38.07
(58) Field of Classification Search ............. 372/29.012, 372/29.014, 29.021, 38.07
See application file for complete search history.

*Primary Examiner* — Armando Rodriguez
(74) *Attorney, Agent, or Firm* — Kent Daniels; Blake, Cassels & Graydon LLP

(57) ABSTRACT

A method of estimating an injection power of seed light injected into an injection-seeded transmitter. A back face monitoring (BFM) response of the injection-seeded transmitter is determined, and data representative of the BFM response stored in a memory. During run-time, a controller of the injection-seeded transmitter, detects a temperature of the injection-seeded transmitter and an instantaneous BFM current. BFM response data is obtained from the memory based on the detected temperature, and the seed light injection power estimated based on the obtained data and the detected instantaneous BFM current.

12 Claims, 4 Drawing Sheets

TRACKING INJECTION SEEDING POWER BASED ON BACK FACET MONITORING (BFM) OF AN INJECTION SEEDED LASER

CROSS-REFERENCE TO RELATED APPLICATIONS

This is the first application filed in respect of the present invention

FIELD OF THE INVENTION

The present application relates generally to controlling injection seeded lasers and, more specifically, to tracking injection seeding power based on Back Facet Monitoring (BFM) of an injection seeded transmitter.

BACKGROUND OF THE INVENTION

In the field of optical communications, it is well known to use semi-conductor laser diodes to generate a narrowband optical signal onto which data is modulated for transmission through an optical medium such as an optical fibre link. In order to obtain desired characteristics of the optical signal (such as center wavelength, line width, signal reach, for example) the output power of the laser diode must be maintained within narrow tolerances. Because different laser diodes have different output power characteristics in response to a given driving current, it is desirable to monitor the output power from each laser diode, and adjust the driving current as needed to maintain the output power at a desired level. FIG. 1 schematically illustrates a feedback control loop 2 for this purpose.

In the feedback control loop 2 of FIG. 1, a semiconductor laser diode 4 is typically constructed as a multi-layer doped semiconductor structure defining a laser cavity in which light is generated in response to a drive current 6 supplied by a controller 8. In the case of a direct modulation transmitter, the drive current 6 will comprise a bias current and a modulation current derived from data being transmitted. In the case of an external modulation transmitter, the drive current 6 will typically comprise only the bias current. Reflective front and back facets 10, 12 define the respective front and back boundaries of the laser cavity. The front facet 10 is designed to be only partially reflective. Light emitted through the front facet 10 forms the optical signal 14 onto which data is modulated for transmission. The optical power level of the optical signal 14 emitted by the front facet 10 is considered to be the output power of the laser diode 4.

By contrast, the back facet 12 is normally designed to be a highly reflective surface, so as to minimize "leakage" of light through the back facet 12, and thereby maximize the output power of the laser diode 4. However, the leakage of light through the back facet 12 is not zero, so that back facet light 16 leaks through the back facet 12 of the diode 4. The power level of the back facet light 16 is known to be proportional to the power level of the optical signal 14 emitted by the front facet 10. This relationship between laser output and back facet light 16 affords the opportunity to monitor the output power from the front facet 10 by detecting the back facet light 16.

Typically, a photodetector 18 is placed proximal the back facet 12 of the laser diode 4 to detect the back facet light 16 emitted through the back facet 12. The output current 20 of the photodetector 18 is proportional to the power level of the back facet light 16, and thus is also proportional to the output power of the optical signal 14 emitted through the front facet 10 of the laser diode 4. The controller 8 can then use various techniques known in the art, to control the output power of the laser 4 by adjusting the laser drive current 6 based on the monitored photodetector current 20. For this reason, the photodetector current 20 may conveniently be referred to as Back Facet Monitoring (BFM) current $I_{BFM}$.

Back Facet Monitoring is commonly used for controlling non-injection seeded lasers, as described above with reference to FIG. 1. It would be desirable to also utilize Back Facet Monitoring to control injection seeded transmitters, including injection seeded lasers and reflective semiconductor optical amplifiers (RSOAs). As may be seen in FIG. 1b, an injection seeded laser 22 receives a seed light 24, which is used in combination with the drive current 6 to generate the output optical signal 14. However, in this case, the back facet light 16 emitted from the back facet 12 includes a first optical component 26 due to the drive current, and a second optical component 28 due to the seed light 24. Consequently, the BFM current 20 is highly dependent on the injection seed light power. This raises a difficulty in that the power level of the injection seed light 24 is unknown, and may change rapidly with time. As a result, conventional BFM techniques cannot be used to control injection seeded lasers. RSOAs suffer the same limitation, and thus cannot be controlled using conventional BFM techniques.

Techniques that overcome the above-noted limitations in the prior art remain highly desirable.

SUMMARY OF THE INVENTION

An aspect of the present invention provides a method of estimating an injection power of seed light injected into an injection-seeded transmitter. A back face monitoring (BFM) response of the injection-seeded transmitter is determined, and data representative of the BFM response stored in a memory. During run-time, a controller of the injection-seeded transmitter detects a temperature of the injection-seeded laser and an instantaneous BFM current. BFM response data is obtained from the memory based on the detected temperature, and the seed light injection power estimated based on the obtained data and the detected instantaneous BFM current.

BRIEF DESCRIPTION OF THE DRAWINGS

Further features and advantages of the present invention will become apparent from the following detailed description, taken in combination with the appended drawings, in which.

DETAILED DESCRIPTION OF PREFERRED EMBODIMENTS

The present invention provides techniques for tracking injection seeding power based on Back Facet Monitoring (BFM) of an injection seeded transmitter. A representative embodiment is described below with reference to FIGS. 2-5.

In very general terms, the injection seed light power by can be tracked (monitored) by first characterising the BFM response of the injection seeded transmitter. This information can be used, during run-time, to determine the respective instantaneous power levels of the injection seed light and the laser output light. This, in turn enables the laser output to be controlled by adjusting the laser bias current. In the following description, two alternative techniques are described. In the first technique described below, the slope of the BFM response is used to estimate the injection seed power level. In the second technique described below, the injection seed power level is estimated from the difference between the BFM response curve for the case of zero seed injection power and the corresponding response curve for the case of a non-zero seed injection power.

As noted above, in the first technique, the injection seed power level is estimated using the slope of the BFM response curve.

Figure 2:
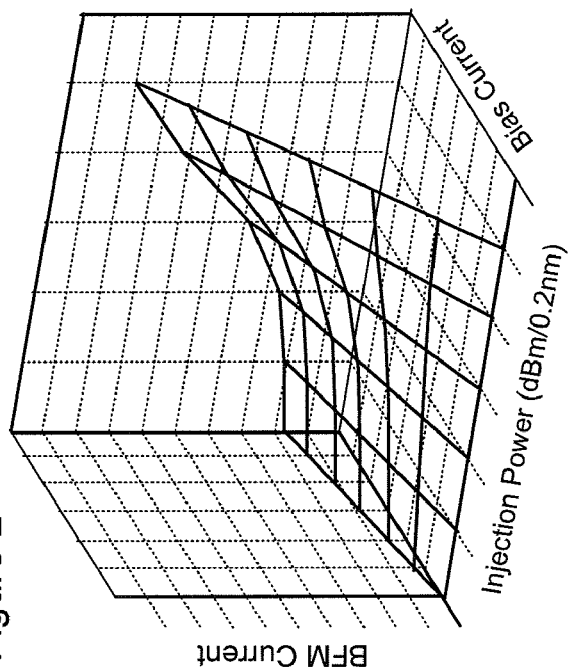
FIG. 2 illustrates a representative response surface of an injection seeded laser.

FIG. 2 is a chart showing the BFM current as a function of seed injection power and bias current, for a typical injection seeded laser. As may be seen in FIG. 2a, the BFM current is an approximately linear function of bias current, and a non-linear function of seed light injection power. In addition, the BFM current is a non-linear function of laser temperature, so that the total BFM response of any given laser may be characterised by determining the respective response surface (FIG. 2) at each one of a set of laser temperature values.

In accordance with the first technique, the BFM response surface (FIG. 2) is analysed to determine the slope of the BFM response, relative to bias current, as a function of seed injection power. One method for performing this computation is to calculate the partial derivative $$\frac{\partial I_{BFM}}{\partial I_{BIAS}},$$

Figure 3:
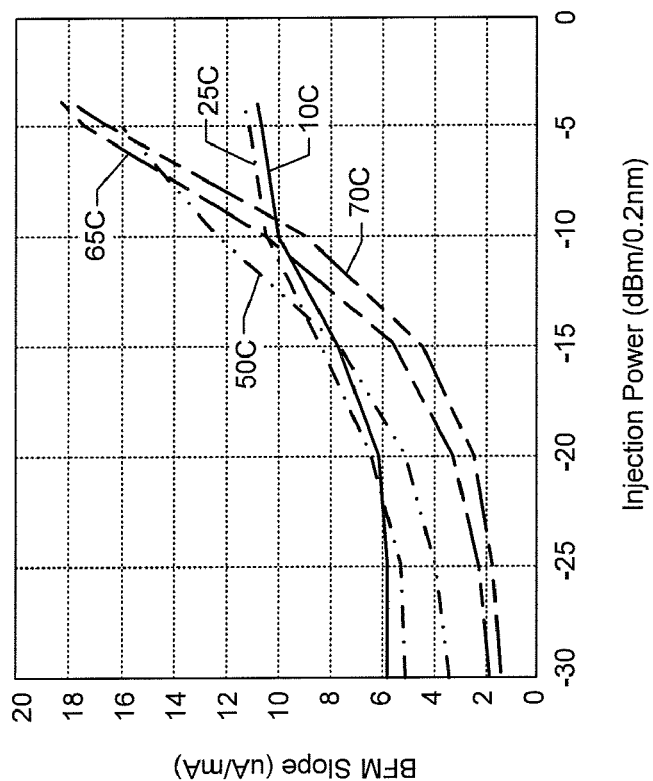
FIG. 3 illustrates representative BFM response slope curves for an injection seeded laser at a set of different temperatures, in accordance with a first embodiment of the present invention.

(where $I_{BFM}$ is the BFM current and $I_{BIAS}$ is the bias current) at each one of a selected set of seed injection power levels. The computed BFM slope values for a desired range of seed light injection power values yields a response slope curve defining the slope of the BFM response as a function of seed light injection power. FIG. 3 is a chart showing a family of response slope curves generating by repeating the above computation for each one of a set of laser temperature values.

Figure 4:
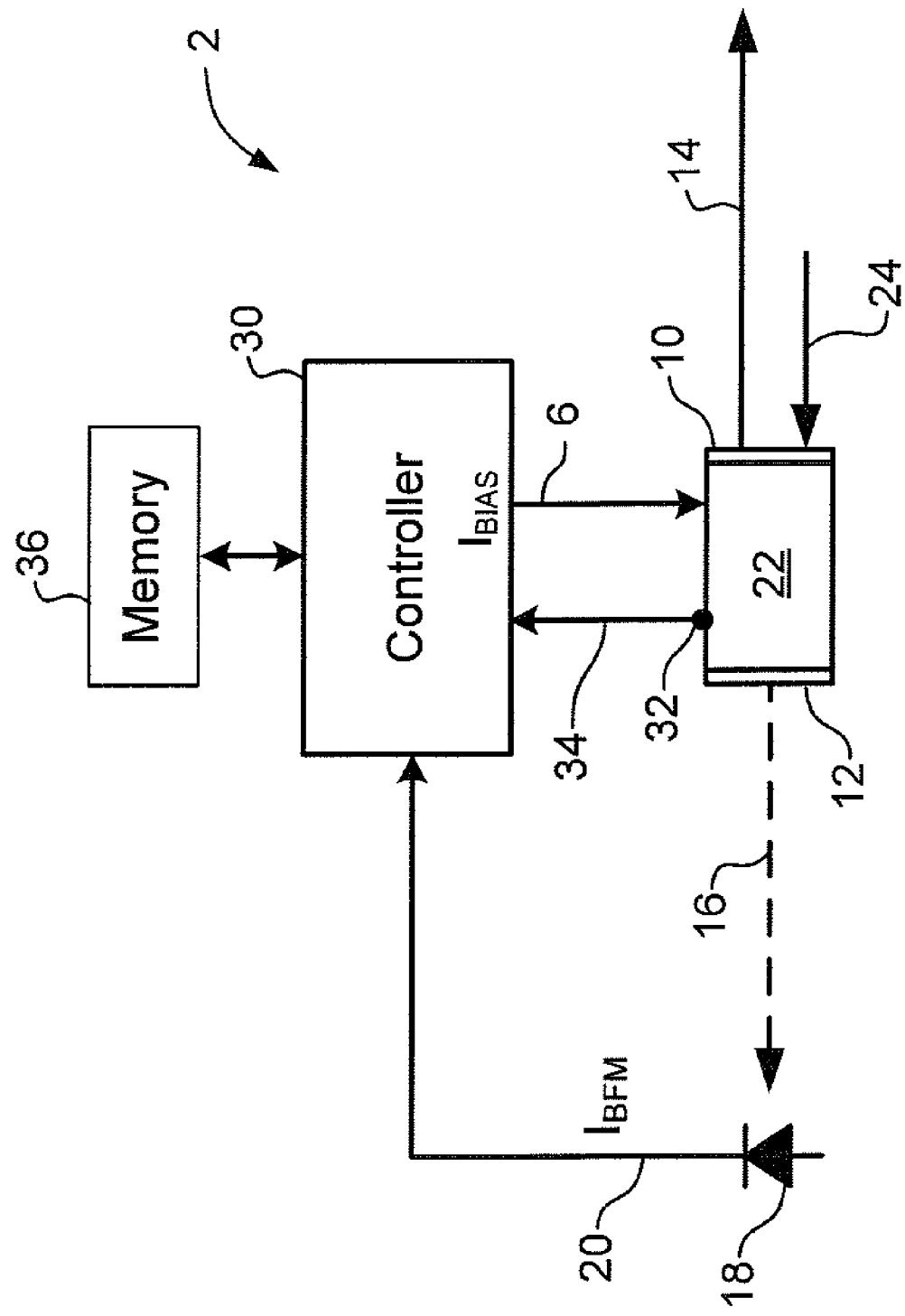
FIG. 4 schematically illustrates principal elements and operations of a feedback control loop for an injection seeded laser, in accordance with an embodiment of the present invention.

As may be seen in FIG. 3, for all temperature values, the response slope increases with increasing injection power, and this effect becomes more pronounced with increasing laser temperature. It is therefore possible to estimate the seed injection power, during run-time, by determining the instantaneous slope of the BFM response, relative to the bias current. FIG. 4 schematically illustrates a representative laser control system implementing this approach.

Figure 1A:
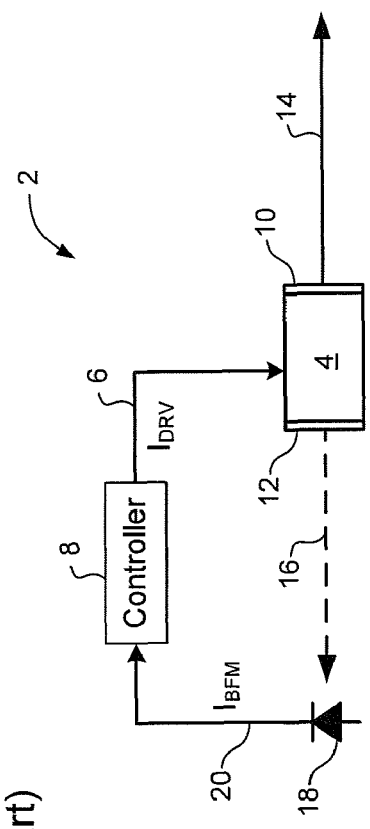
FIGS. 1a and 1b schematically illustrate conventional laser feedback control loops known in the prior art.
Figure 1B:
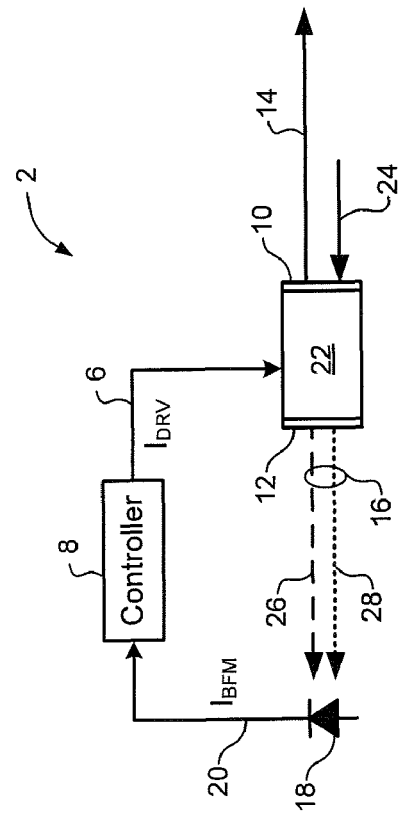

In the embodiment of FIG. 4, the injection seeded laser 22 is constructed and operates in the same manner as described above with reference to FIG. 1. Accordingly, semiconductor laser 22 is typically constructed as a multi-layer doped semiconductor structure defining a laser cavity in which light is generated in response to a drive current 6 supplied by a controller 30. Reflective front and back facets 10, 12 define the respective front and back boundaries of the laser cavity. The front facet 10 is partially reflective and thus emits optical signal 14. The back facet 12 is highly reflective, so as to minimize "leakage" of light through the back facet 12, and thereby maximize the output power of the optical signal 14. The power level of the back facet light 16 emitted through the back facet 12 is detected by a photodetector 18 is placed proximal the back facet 12 of the laser 22. The back facet monitoring (BFM) current 20 output from the photodetector 18 is supplied to the controller 30. In addition, a temperature sensor 32 (such as, for example, a thermocouple) detects the temperature of the laser 22, and supplies a corresponding temperature signal 34 to the controller 30.

As an initial step, the BFM response of the laser 22 is determined, as described above with reference to FIGS. 2 and 3, and data representative of a set of BFM slope curves (FIG. 3) stored in a memory 36 of the controller 30. Since the laser 22 and its feedback control loop will typically be manufactured and sold as an integrated package, this operation can conveniently be performed by the manufacturer of the laser integrated package, for example as part of product inspection and calibration processes.

During operation of the laser 22, the controller 30 can use the detected temperature of the laser 22 to select the appropriate BFM slope curve stored in the memory 36. In some embodiments, the controller 30 may use the data stored in the memory 36 to compute (e.g. by interpolation) a set of BFM slope values for the detected laser temperature. This approach can be used to obtain BFM slope values for laser temperatures lying between the specific temperature values for which data is stored in the memory 36.

In addition, the controller 30 can estimate the instantaneous slope of the BFM response, by alternately offsetting the bias current a predetermined amount above and below its present value, and detecting the corresponding changes in the BFM current. Once the instantaneous slope of the BFM response has been estimated in this manner, the controller 30 can use the selected (or computed) BFM slope data to estimate the seed injection power.

As may be appreciated, the technique described above enables the seed injection power to be estimated during run time. However, this technique requires that the bias current be repeatedly offset (or dithered), in order to monitor the instantaneous BFM response slope. In some cases, dithering the bias current in this manner may be undesirable. The second technique, which avoids this difficulty, is described below.

In the second technique, the injection seed power level is estimated from the difference between the BFM response for the case of zero seed injection power and the corresponding response for the case of a non-zero seed injection power. Referring back to FIG. 2, it may be seen that, for the case of zero seed injection power, the BFM response is an approximately linear function of bias current. For any given (fixed) value of bias current, increasing the seed injection power from zero produces a corresponding increase in the BFM current.

Figure 5:
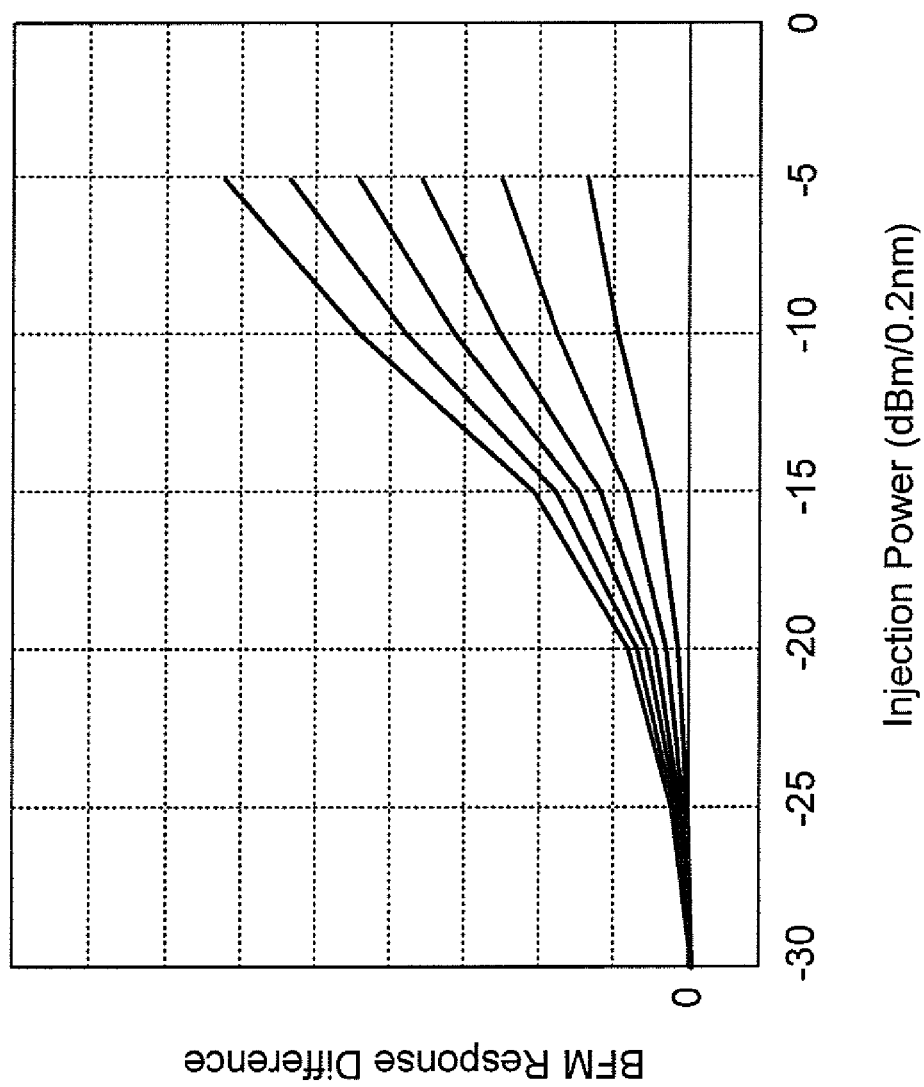
FIG. 5 illustrates a representative set of normalized BFM response curves for an injection seeded laser for a set of different bias current values, in accordance with a second embodiment of the present invention.

In accordance with the second technique, the BFM response surface (FIG. 2) is analysed to determine a normalized BFM response to seed injection power, as a function of bias current. One method for performing this computation is to calculate the difference $\Delta I_{BFM} = I_{BFM}(x) - I_{BFM}(0)$, where $I_{BFM}(x)$ is the BFM current for a given non-zero seed injection power level and $I_{BFM}(0)$ is the BFM current for zero seed injection power level, for each one of a selected set of bias current levels. Repeating this calculation for each value of bias current yields a family of BFM response difference curves that define the normalized BFM response as a function of seed light injection power. FIG. 5 is a chart showing a normalized BFM response a given laser temperature. The total normalized BFM response can be derived by repeating the above calculations for each one of a set of laser temperature values.

As may be seen in FIG. 5, the BFM current increases with increasing seed injection power, and this trend hold true for all values of the bias current. It is therefore possible to estimate the seed injection power, during run-time, by correlating the instantaneous BFM current with the bias current.

As an initial step, the BFM response of the laser 22 is determined, as described above with reference to FIGS. 2 and 3, and data representative of a set of BFM difference curves (FIG. 5) stored in the memory 36 of the controller 30. Since the laser 22 and its feedback control loop will typically be manufactured and sold as an integrated package, this operation can conveniently be performed by the manufacturer of the laser integrated package, for example as part of product inspection and calibration processes.

During operation of the laser 22, the controller 30 can use the detected temperature of the laser 22 and the known bias current value the appropriate BFM difference curve stored in the memory 36. In some embodiments, the controller 30 may use the data stored in the memory 36 to compute (e.g. by interpolation) a set of BFM difference values for the detected laser temperature and instantaneous bias current. This approach can be used to obtain BFM difference values for laser temperature and/or bias current values lying between the specific values for which data is stored in the memory 36.

The controller 30 can use the selected (or computed) BFM difference data and the instantaneous BFM current to estimate the seed injection power. For example, for the known bias current value, the BFM current $I_{BFM}(0)$ for zero seed injection power level can be retrieved from memory and subtracted from the instantaneous value of the BFM current 20. The resulting BFM difference value can then be compared to the selected (or computed) BFM difference data from the memory 36 to estimate the seed injection power level.

In the foregoing description, the invention is described by way of example embodiments in which the injection seeded transmitter is a laser. However, the person of ordinary skill in the art will recognise that the same techniques may equally be used to control an injection seeded Reflective Semiconductor Optical Amplifier (RSOA). Thus it will be appreciated that the present invention is not limited to injection seeded lasers.

The embodiments of the invention described above are intended to be illustrative only. The scope of the invention is therefore intended to be limited solely by the scope of the appended claims.

We claim:

1. A method of estimating an injection power of seed light injected into an injection-seededtransmitter, the method comprising:
   preliminarily determining a back face monitoring (BFM) response of the injection-seededtransmitter, and storing data representative of the BFM response in a memory; and
   during run-time, a controller of the injection-seededtransmitter:
      detecting a temperature of the injection-seeded transmitter and an instantaneous BFM current;
      obtaining BFM response data from the memory based on the detected temperature; and
      estimating the seed light injection power based on the obtained data and the detected instantaneous BFM current.

2. The method as claimed in claim 1, wherein determining a back face monitoring (BFM) response of the injection-seeded transmitter comprises:
   determining a BFM response surface of the injection seeded laser as a function of bias current and seed injection power;
   analysing the BFM response surface to compute a BFM response slope curve defining the slope of the BFM response surface, relative to bias current, as a function of seed injection power;
   wherein data representative of the BFM response slope curve is stored in the memory.

3. The method as claimed in claim 2, wherein a respective BFM response slope curve is computed for each one of a set of predetermined temperature values of the injection seeded transmitter, respective data representative of each BFM response slope curve being stored in the memory.

4. The method as claimed in claim 3, wherein obtaining BFM response data from the memory comprises selecting data representative of one BFM response slope based on the detected temperature.

5. The method as claimed in claim 3, wherein obtaining BFM response data from the memory comprises computing the BFM response data from data representative of two or more BFM response slopes stored in the memory, based on the detected temperature.

6. The method as claimed in claim 1, wherein estimating the seed light injection power comprises:
   determining an instantaneous slope of the BFM response; and
   comparing the determined instantaneous slope to the obtained BFM response data.

7. The method as claimed in claim 6, wherein determining the instantaneous slope of the BFM response comprises:
   dithering the bias current; and
   detecting changes in the instantaneous BFM current corresponding to the bias current dither.

8. The method as claimed in claim 1, wherein determining a back face monitoring (BFM) response of the injection-seeded transmitter comprises:
   determining a BFM response surface of the injection seeded transmitter as a function of bias current and seed injection power;
   analysing the BFM response surface to compute a set of normalized BFM response curves defining the BFM response to seed injection power, as a function of bias current;
   wherein data representative of the set of normalized BFM response curves is stored in the memory.

9. The method as claimed in claim 8, wherein a respective set of normalized BFM response curves is computed for each one of a set of predetermined temperature values of the injection seeded transmitter, respective data representative of each set of normalized BFM response curves being stored in the memory.

10. The method as claimed in claim 9, wherein obtaining BFM response data from the memory comprises selecting data representative of one normalized BFM response curve based on the detected temperature and an instantaneous value of the bias current.

11. The method as claimed in claim 9, wherein obtaining BFM response data from the memory comprises computing the BFM response data from data representative of two or more nomialized BFM response curves, based on the detected temperature and an instantaneous value of the bias current.

12. The method as claimed in claim 8, wherein estimating the seed light injection power comprises:

analysing the obtained BFM response data to determine a BFM current for zero seed injection power;

determining a difference between an instantaneous value of the BFM current and the determined BFM current for zero seed injection power; and comparing the determined difference to the obtained BFM response data.

* * * * *